(12) United States Patent
Wang et al.

(10) Patent No.: US 9,455,242 B2
(45) Date of Patent: Sep. 27, 2016

(54) SEMICONDUCTOR OPTOELECTRONIC DEVICE

(75) Inventors: Hsin-Ying Wang, Hsinchu (TW);
Yi-Ming Chen, Hsinchu (TW);
Tzu-Chieh Hsu, Hsinchu (TW);
Chi-Hsing Chen, Hsinchu (TW);
Chien-Kai Chung, Hsinchu (TW);
Min-Hsun Hsieh, Hsinchu (TW);
Chia-Liang Hsu, Hsinchu (TW);
Chao-Hsing Chen, Hsinchu (TW);
Chiu-Lin Yao, Hsinchu (TW);
Chien-Fu Huang, Hsinchu (TW);
Hsin-Mao Liu, Hsinchu (TW);
Hsiang-Ling Chang, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 34 days.

(21) Appl. No.: 13/226,095

(22) Filed: Sep. 6, 2011

(65) Prior Publication Data

US 2012/0055532 A1 Mar. 8, 2012

Related U.S. Application Data

(60) Provisional application No. 61/380,258, filed on Sep. 6, 2010.

(30) Foreign Application Priority Data

Apr. 6, 2011 (TW) .............................. 100112126 A

(51) Int. Cl.
*H01L 31/042* (2014.01)
*H01L 33/00* (2010.01)
(Continued)

(52) U.S. Cl.
CPC ........... *H01L 25/0753* (2013.01); *H01L 24/24* (2013.01); *H01L 24/82* (2013.01);
(Continued)

(58) Field of Classification Search
CPC ........... H01L 25/0753; H01L 31/1892; H01L 24/24; H01L 24/82; H01L 33/0079; H01L 33/44; H01L 33/62; H01L 2924/124041; H01L 2924/01029; H01L 2924/00; Y02E 10/50
USPC ............ 136/244; 257/99, E33.001, E33.055, 257/E31.099, E31.105, E25.028, E25.019
See application file for complete search history.

(56) References Cited

U.S. PATENT DOCUMENTS 4,547,622 A * 10/1985 Fan et al. ...................... 136/249
6,856,087 B2 2/2005 Lin et al.
(Continued)

FOREIGN PATENT DOCUMENTS

EP 1 418 624 A 5/2004
JP 10256597 * 9/1998 .................... 136/256
(Continued)

OTHER PUBLICATIONS

Sang-Il Park, et al., "Printed Assemblies of Inorganic Light-Emitting Diodes for Deformable and Semitransparent Displays", Science 325, 977 (2009) Aug. 21, 2009.

*Primary Examiner* — Tamir Ayad
*Assistant Examiner* — Uyen Tran
(74) *Attorney, Agent, or Firm* — Muncy, Geissler, Olds & Lowe, P.C.

(57) ABSTRACT

A semiconductor optoelectronic device comprises a growth substrate; a semiconductor epitaxial stack formed on the growth substrate comprising a sacrificial layer with electrical conductivity formed on the growth substrate; a first semiconductor material layer having a first electrical conductivity formed on the sacrificial layer, and a second semiconductor material layer having a second electrical conductivity formed on the first semiconductor material layer; and a first electrode directly formed on the growth substrate and electrically connected to the semiconductor epitaxial stack via the growth substrate.

11 Claims, 17 Drawing Sheets
(9 of 17 Drawing Sheet(s) Filed in Color)

(51) Int. Cl.
  *H01L 25/075* (2006.01)
  *H01L 31/18* (2006.01)
  *H01L 23/00* (2006.01)
  H01L 33/44 (2010.01)
  H01L 33/62 (2010.01)

(52) U.S. Cl.
  CPC ....... *H01L31/1892* (2013.01); *H01L 33/0079* (2013.01); *H01L 33/44* (2013.01); *H01L 33/62* (2013.01); *H01L 2924/01029* (2013.01); *H01L 2924/12041* (2013.01); *Y02E 10/50* (2013.01)

(56) References Cited

U.S. PATENT DOCUMENTS

| | | |
|---|---|---|
| 6,913,985 B2 | 7/2005 | Ogihara et al. |
| 7,180,099 B2 | 2/2007 | Ogihara et al. |
| 7,557,367 B2 | 7/2009 | Rogers et al. |
| 7,825,328 B2 * | 11/2010 | Li ................... 136/249 |
| 7,847,298 B2 * | 12/2010 | Ogihara et al. .......... 257/79 |
| 2004/0259331 A1 | 12/2004 | Ogihara et al. |
| 2005/0225973 A1 * | 10/2005 | Eliashevich et al. ......... 362/217 |
| 2005/0230694 A1 * | 10/2005 | See et al. ................ 257/94 |
| 2006/0163603 A1 * | 7/2006 | Takeuchi et al. .......... 257/103 |
| 2006/0208265 A1 * | 9/2006 | Yukimoto et al. .......... 257/88 |
| 2007/0252156 A1 * | 11/2007 | Ogihara et al. .......... 257/79 |
| 2007/0272933 A1 * | 11/2007 | Kim et al. .............. 257/94 |
| 2009/0267085 A1 * | 10/2009 | Lee et al. .............. 257/88 |
| 2010/0078656 A1 | 4/2010 | Seo et al. |

FOREIGN PATENT DOCUMENTS

| | | | |
|---|---|---|---|
| JP | P10256597 | * 9/1998 | ............ 136/256 |
| TW | 434917 | 5/2001 | |
| WO | WO2008/143635 A1 | 11/2008 | |

* cited by examiner

SEMICONDUCTOR OPTOELECTRONIC DEVICE

REFERENCE TO RELATED APPLICATION

This application claims the right of priority based on U.S. provisional application Ser. No. 61/380,258, filed on Sep. 6, 2010, and Taiwan application Serial No. 100112126, filed on Apr. 6, 2011, and the content of which is hereby incorporated by reference in its entirety.

TECHNICAL FIELD

The application relates to a semiconductor optoelectronic device and a manufacturing method thereof, and in particular, to the semiconductor optoelectronic device transferred to an operating substrate and the manufacturing method thereof.

DESCRIPTION OF BACKGROUND ART

The science and technology change every day, and the semiconductor optoelectronic device contributes to the information transmission and the energy conversion. Taking the application of the system as an example, the semiconductor optoelectronic device contributes to the optic fiber communication, the optical storage and the military system. The semiconductor optoelectronic device is classified into three types according to the energy conversion: conversion from electricity into light emission such as light-emitting diode and laser diode; conversion from optical signal into electronic signal such as photon detector; conversion from light radiation into electricity such as solar cell.

The growth substrate is important for the semiconductor optoelectronic device. The semiconductor epitaxial structure of the semiconductor optoelectronic device is grown on the substrate which also provides the support function. Thus, choosing a suitable growth substrate is a key factor for the growth quality of the semiconductor optoelectronic device.

However, sometimes a good substrate for growing the device may be not a good substrate for supporting the device. Taking the conventional red light-emitting diode as an example, the opaque GaAs substrate is used to be the growth substrate to improve the growth quality of the device in the light emitting for the lattice constant of the GaAs is close to that of the semiconductor epitaxial structure. But for the light-emitting device intensifying the light emission, the opaque growth substrate reduces the light emission efficiency of the device during the operation.

A substrate transfer technology is developed in considering the different requirements of the growth substrate and the support substrate of the semiconductor optoelectronic device. The semiconductor epitaxial structure is grown on the growth substrate first, and then the semiconductor epitaxial structure is transferred to the support substrate for the following device operation. The removal of the original growth substrate is a key factor of the transfer method for combining the semiconductor epitaxial structure and the support substrate.

In the conventional technology, the removal method of the growth substrate includes: dissolving the original growth substrate with the etchant, physically polishing, or separating the growth substrate and the semiconductor by etching the sacrificial layer by disposing a sacrificial layer between the growth substrate and the semiconductor epitaxial structure in advance. However, whether dissolving the substrate with the etchant or polishing the substrate physically, the original growth substrate is damaged. In the modern-day of environmental protection and energy conservation, the growth substrate not being re-used is undoubtedly a waste of materials. However, how to selectively transfer is one of the research directions for the semiconductor optoelectronic device while using the sacrificial layer for separation purpose.

SUMMARY OF THE APPLICATION

In order to transfer the semiconductor optoelectronic device selectively and efficiently, the present application provides a semiconductor optoelectronic device and a manufacturing method thereof, and in particular, to the manufacturing method of transferring the semiconductor optoelectronic device to an operating substrate, and the manufacturing method of the semiconductor optoelectronic device by using the remaining semiconductor epitaxial stack unit on the growth substrate.

An embodiment of the present application provides a semiconductor optoelectronic device comprising a growth substrate; a semiconductor epitaxial stack formed on the growth substrate comprising a sacrificial layer with electrical conductivity formed on the growth substrate; a first semiconductor material layer having a first electrical conductivity formed on the sacrificial layer, and a second semiconductor material layer having a second electrical conductivity formed on the first semiconductor material layer; and a first electrode directly formed on the growth substrate and electrically connected to the semiconductor epitaxial stack via the growth substrate.

BRIEF DESCRIPTION OF THE DRAWINGS

The patent or application file contains at least one drawing executed in color. Copies of this patent or patent application publication with color drawings will be provided by the Office upon request and payment of the necessary fee.

DETAILED DESCRIPTION OF PREFERRED EMBODIMENTS

Figure 1A:
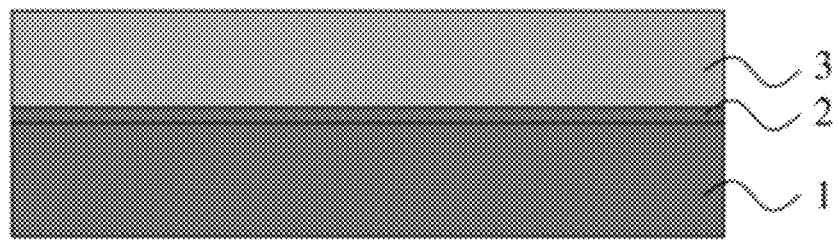
FIG. 1A illustrates a lateral view of the manufacturing method of a semiconductor optoelectronic device.
Figure 1B:
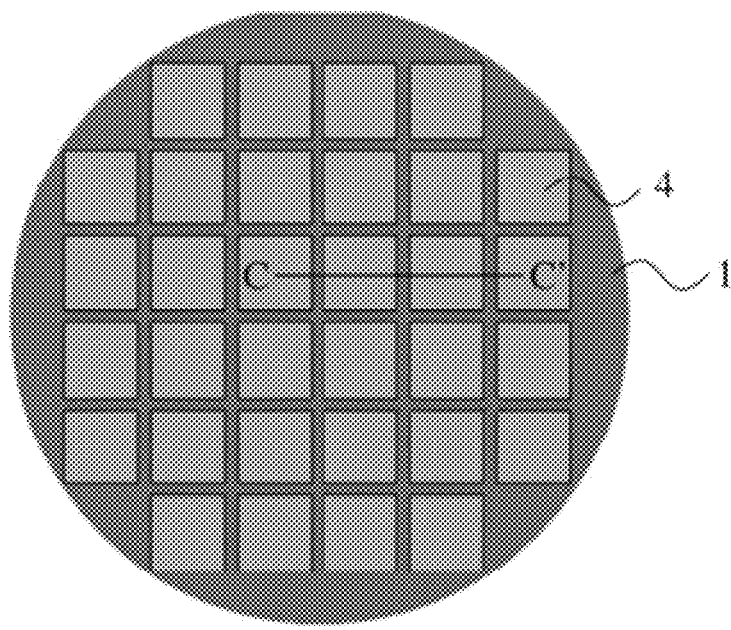
FIG. 1B illustrates a top view of the manufacturing method of a semiconductor optoelectronic device.
Figure 1C:
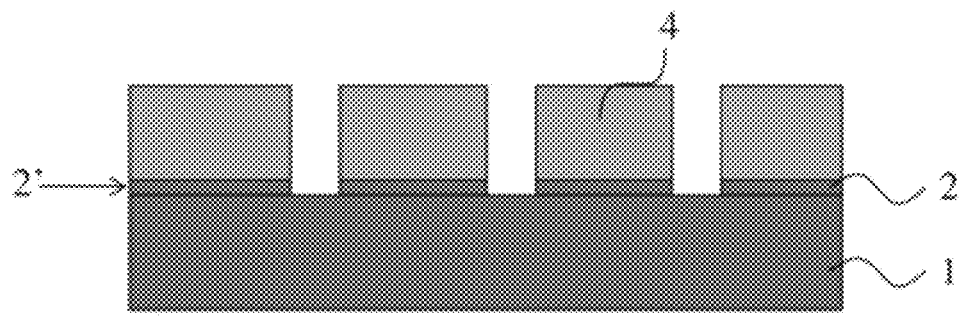
FIG. 1C illustrates a lateral view taken along line C-C' of FIG. 1B.

With reference to FIG. 1, a manufacturing method of a semiconductor optoelectronic device according to an embodiment of the present application is described. As shown in FIG. 1A, a growth substrate 1 is provided first, a sacrificial layer 2 is formed on the growth substrate 1, and a semiconductor epitaxial stack 3 is formed on the sacrificial layer 2. The material of the growth substrate 1 comprises sapphire ($Al_2O_3$), silicon (Si), silicon carbide (SiC), gallium nitride (GaN), and gallium arsenide (GaAs). The material of the sacrificial layer 2 comprises aluminum arsenide (AlAs), aluminum gallium arsenide (AlGaAs), and zinc oxide (ZnO). The semiconductor epitaxial stack 3 can be a light-emitting diode epitaxial stack and/or a solar cell epitaxial stack. As shown in FIG. 1B and FIG. 1C, the semiconductor epitaxial stack is separated into a plurality of semiconductor epitaxial stack units 4 by the conventional manufacturing method such as dry etch, wet etch, and laser scribing. As shown in FIG. 1C, a sidewall 2' of the sacrificial layer 2 under the plurality of semiconductor epitaxial stack units 4 is exposed after the separation. Similarly, the semiconductor epitaxial stack unit 4 can be the light-emitting diode epitaxial stack area and/or the solar cell epitaxial stack area.

Figure 2:
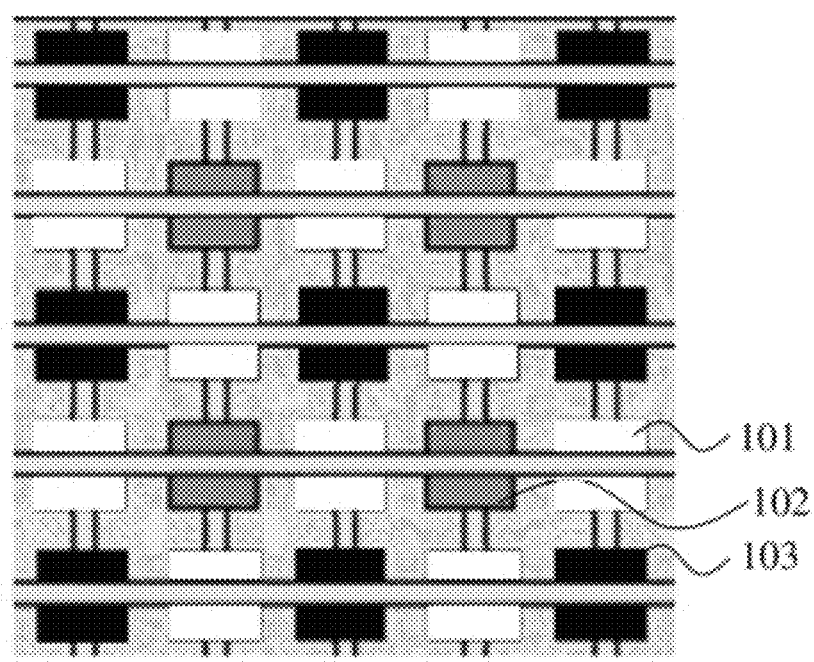
FIG. 2 illustrates a top view of a multi-color display device.

After the plurality of semiconductor epitaxial stack units 4 is formed on the growth substrate 1 by the above-described method, the semiconductor epitaxial stack unit 4 is selectively transferred to an operating substrate based on the following process or the application requirement. Taking FIG. 2 as an example, a multi-color display device comprises a red light semiconductor epitaxial stack unit 101, a green light semiconductor epitaxial stack unit 102, and a blue light semiconductor epitaxial stack unit 103. For the multi-color display device, when the plurality of semiconductor epitaxial stack units 4 of the growth substrate emits the red light wavelength, the semiconductor epitaxial stack units 4 are alternately and selectively transferred to the operating substrate, namely, the multi-color display device, from the growth substrate 1 based on the disposition of the red light semiconductor epitaxial stack unit 101 on the multi-color display device.

Figure 3A:
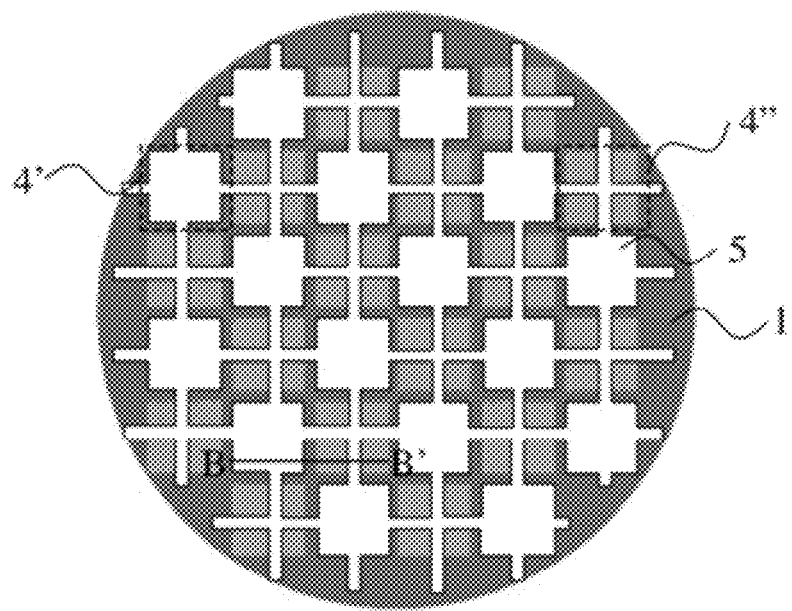
FIG. 3A illustrates a top view of the manufacturing method of a semiconductor optoelectronic device.
Figure 3B:
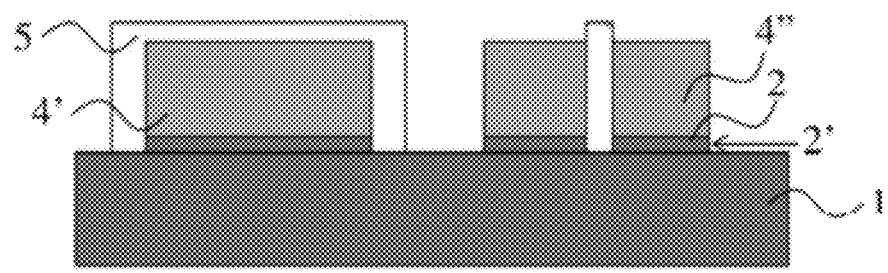
FIG. 3B illustrates a lateral view taken along line B-B' of FIG. 3A.
Figure 3C:
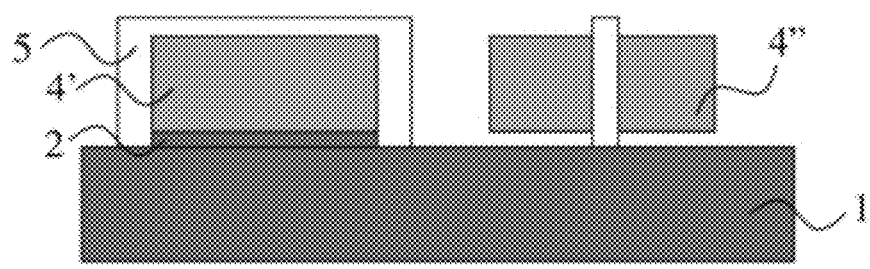
FIG. 3C illustrates a lateral view of the manufacturing method of a semiconductor optoelectronic device.

For the transferring processes described in FIGS. 3A-3C, a second semiconductor epitaxial stack unit 4" which needs to be transferred and a first semiconductor epitaxial stack unit 4' which does not need to be transferred are covered by different photoresist to be selectively transferred later with the following steps. As shown in FIG. 3A and FIG. 3B, part of the semiconductor epitaxial stack unit 4 is covered by a patterned photoresist layer 5 in order to selectively transfer a specific part of the semiconductor epitaxial stack unit 4: for the first semiconductor epitaxial stack unit 4' which does not need to be transferred, the surface of the semiconductor epitaxial stack and the exposed sidewall 2' of the sacrificial layer are totally covered by the patterned photoresist; for the second semiconductor epitaxial stack unit 4" which needs to be transferred, part of the second semiconductor epitaxial stack unit 4" is covered by the patterned photoresist for fixation purpose, and the sidewall 2' of the sacrificial layer is exposed. The sacrificial layer 2 of the second semiconductor epitaxial stack unit 4" is removed via the exposed sidewall 2' of the sacrificial layer by the conventional etch method such as wet etch. After the step, the sacrificial layer 2 under part of the semiconductor epitaxial stack unit 4 is selectively removed. FIG. 3C illustrates the lateral view of the result that part of the sacrificial layer 2 is removed by taking along line B-B' in FIG. 3A.

After all of the semiconductor epitaxial stack units 4 on the growth substrate are removed, the original growth substrate can be recycled for use after common clean process because the original growth substrate is not damaged.

In addition, the adhesion between the sacrificial layer 2 and the semiconductor epitaxial stack unit 4 can also be reduced by the wet-oxygen etching that changes the characteristics of the material of the sacrificial layer 2.

Figure 4A:
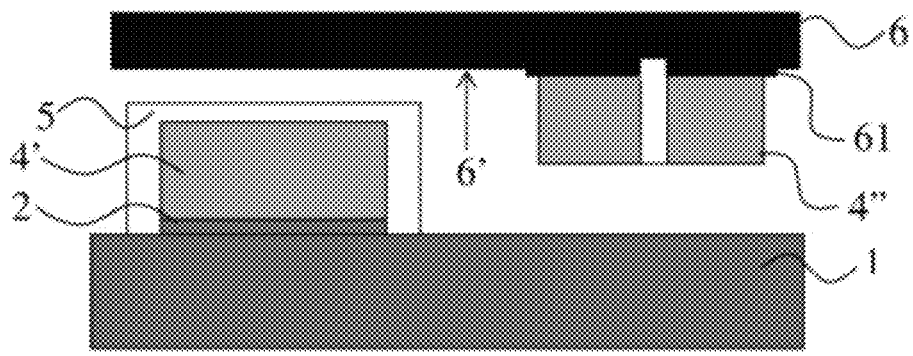
FIG. 4A illustrates a lateral view of the manufacturing method of a semiconductor optoelectronic device.

In order to selectively transfer part of the semiconductor epitaxial stack unit whose sacrificial layer 2 is removed efficiently, namely, the second semiconductor epitaxial stack unit 4", a transfer structure 6 is used for the transfer process. The material of the transfer structure 6 comprises organic polymer materials like expanded polystyrene or PI tape. The transfer structure 6 comprises a transfer surface 6' facing the semiconductor epitaxial stack unit 4. The transfer surface 6' comprises an adhesive surface or at least one protrusion 61 corresponding to the second semiconductor epitaxial stack unit 4" which needs to be transferred. The second semiconductor epitaxial stack unit 4" is transferred to the transfer structure 6 by the adhesion of the transfer surface 6' or the electrostatic attraction of the electric charges accumulated between the protrusion 61 of the transfer surface and the surface of the second semiconductor epitaxial stack unit 4" as shown in FIG. 4A.

Figure 4B:
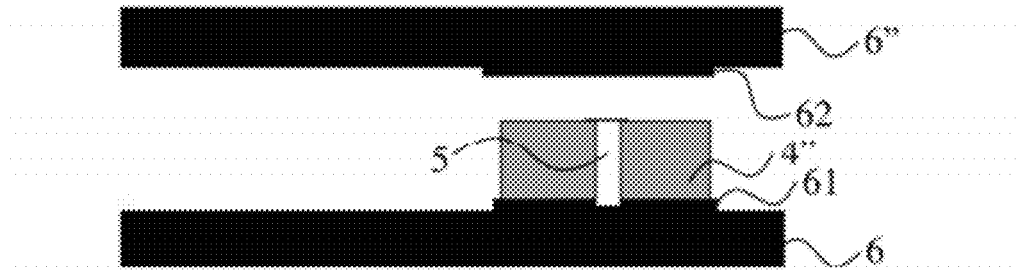
FIG. 4B illustrates a lateral view of the manufacturing method of a semiconductor optoelectronic device.
Figure 4C:
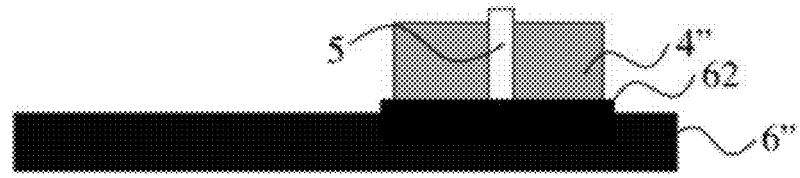
FIG. 4C illustrates a lateral view of the manufacturing method of a semiconductor optoelectronic device.
Figure 4D:
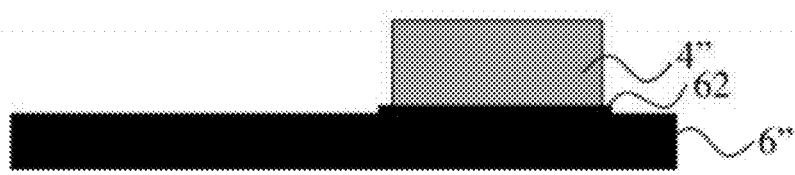
FIG. 4D illustrates a lateral view of the manufacturing method of a semiconductor optoelectronic device.

In addition, part of the patterned photoresist layer 5 still sticks to the second semiconductor epitaxial stack unit 4" which is transferred to the transfer structure 6. Therefore, a second transfer process is performed to remove the patterned photoresist layer 5, or to invert the second semiconductor epitaxial stack unit 4" onto the operating substrate when the structure design requires. As shown in FIGS. 4B-4D, the original patterned photoresist layer 5 covering part of the second semiconductor epitaxial stack unit 4" still sticks to the second semiconductor epitaxial stack unit 4" and the transfer structure 6, and is not removed when the second semiconductor epitaxial stack unit 4" is transferred to the transfer structure 6. In that case, the second semiconductor epitaxial stack unit 4" formed on the transfer structure 6 can be transferred to a second transfer structure 6" first, the patterned photoresist layer 5 stuck to the second semiconductor epitaxial stack unit 4" is removed by the photoresist remover, and the second semiconductor epitaxial stack unit 4" formed on the second transfer structure 6" is transferred to the operating substrate 7 in the second transfer process. Similarly, the material of the second transfer structure 6" comprises organic polymer materials like expanded polystyrene or PI tape. The second transfer structure 6" comprises a transfer surface facing the transferred semiconductor epitaxial stack unit 4". The transfer surface comprises an adhesive surface or at least one protrusion 62 corresponding to the second semiconductor epitaxial stack unit 4" which needs to be transferred. The second semiconductor epitaxial stack unit 4" is transferred to the second transfer structure 6" by the adhesion of the second transfer surface 6" or the electrostatic attraction of the electric charges accumulated between the protrusion 62 of the transfer surface and the surface of the second semiconductor epitaxial stack unit 4".

Figure 4E:
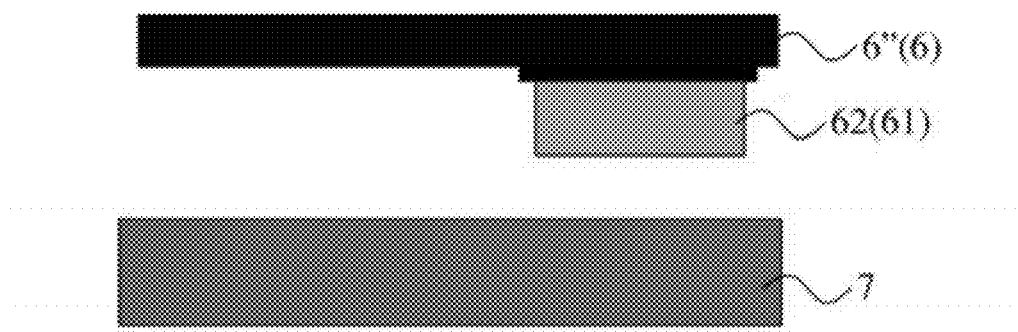
FIG. 4E illustrates a lateral view of the manufacturing method of a semiconductor optoelectronic device.

As shown in FIG. 4E, the second semiconductor epitaxial stack unit 4" is transferred from the second transfer structure 6" to the operating substrate 7. The second semiconductor epitaxial stack unit 4" can be transferred from the transfer structure 6 to the operating substrate 7 in the similar method if the transfer process is performed only once.

Figure 5A:
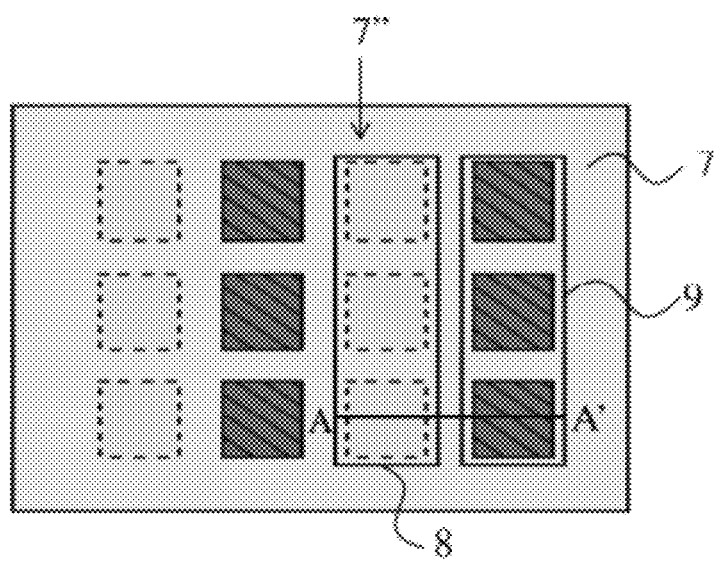
FIG. 5A illustrates a top view of the manufacturing method of a semiconductor optoelectronic device.
Figure 5B:
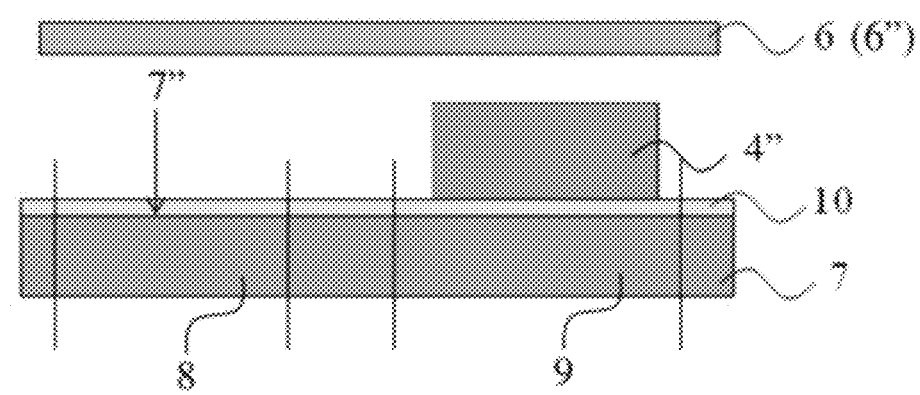
FIG. 5B illustrates a lateral view taken along line A-A' of FIG. 5A.

As shown in FIG. 5A, the operating substrate 7 comprises a plurality of electrode areas 8 and a plurality of epitaxial areas 9. The electrode area 8 and the epitaxial area 9 are formed at intervals. The material of the operating substrate 7 comprises sapphire ($Al_2O_3$), silicon (Si), silicon carbide (SiC), gallium nitride (GaN), gallium arsenide (GaAs), and aluminum nitride (AlN). Or, the operating substrate 7 can be a PCB substrate or a FR4 substrate. The method to transfer the plurality of second semiconductor epitaxial stack units 4" formed on the transfer structure 6 (or the second transfer structure 6") to the operating substrate 7 is by forming an adhesive layer 10 between the operating substrate 7 and the second semiconductor epitaxial stack unit 4", and sticking the operating substrate 7 and the second semiconductor epitaxial stack unit 4" through heating. Because the adhesion between the second semiconductor epitaxial stack unit 4" and the transfer structure 6 (6") is reduced by heating (the adhesion of the transfer surface 6' is reduced by heating), and the adhesion between the adhesive layer 10 and the second semiconductor epitaxial stack unit 4" is enhanced, the second semiconductor epitaxial stack unit 4" is transferred to the operating substrate 7 from the transfer structure 6 (6"). The material of the adhesive layer 10 comprises organic polymers, metal, and metal alloy. In addition, in order to increase the light emission efficiency or for other purposes, the surface 7" of the operating substrate 7 is optionally textured by comprising at least a protrusion (not shown in the drawings) and/or a cavity (not shown in the drawings). As shown in FIG. 5B, part of the second semiconductor epitaxial stack unit 4" is selectively transferred to the epitaxial area 9 of the operating substrate 7, and is formed at intervals relative to the electrode area 8.

Figure 6:
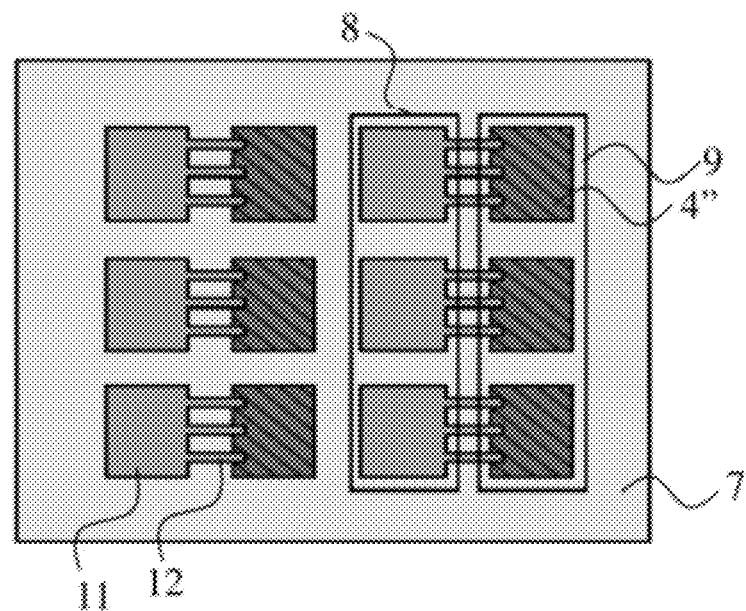
FIG. 6 illustrates a top view of the manufacturing method of a semiconductor optoelectronic device.

Finally, as shown in FIG. 6, a first electrode 11 is formed on the electrode area 8 of the operating substrate 7. The first electrode 11 is electrically connected to the second semiconductor epitaxial stack unit 4" which is transferred to and positioned on the epitaxial area 9 by a metal wire extended from the first electrode 11 or other conductive medium like indium tin oxide, cadmium tin oxide, zinc oxide, indium oxide, tin oxide, copper aluminum oxide, copper gallium oxide, strontium copper oxide, aluminum zinc oxide, zinc gallium oxide, and transparent conductive materials arbitrary composed by the materials mentioned above.

In addition, the process steps further comprise forming a second electrode (not shown in the drawings) between the second semiconductor epitaxial stack unit 4" and the operating substrate 7, or on the opposite side of the operating substrate 7 corresponding to the second semiconductor epitaxial stack unit 4" for the electrical conductivity purpose of the device.

Figure 7A:
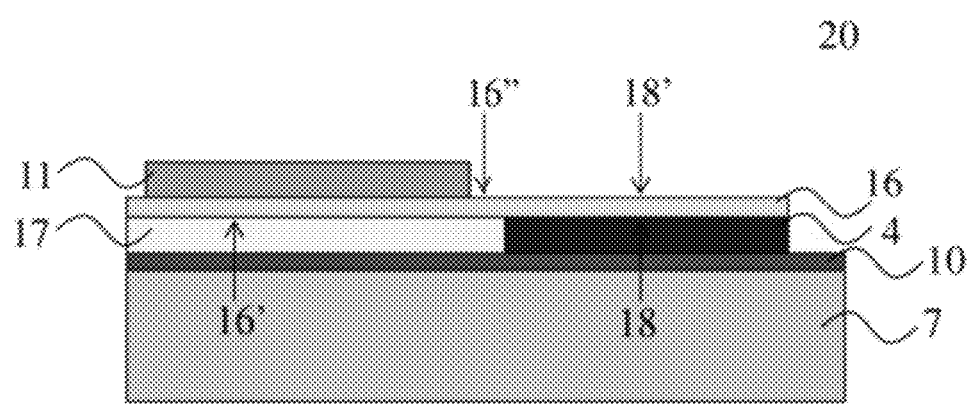
FIG. 7A illustrates a lateral view of a semiconductor optoelectronic device structure according to another embodiment of the present application.
Figure 8:
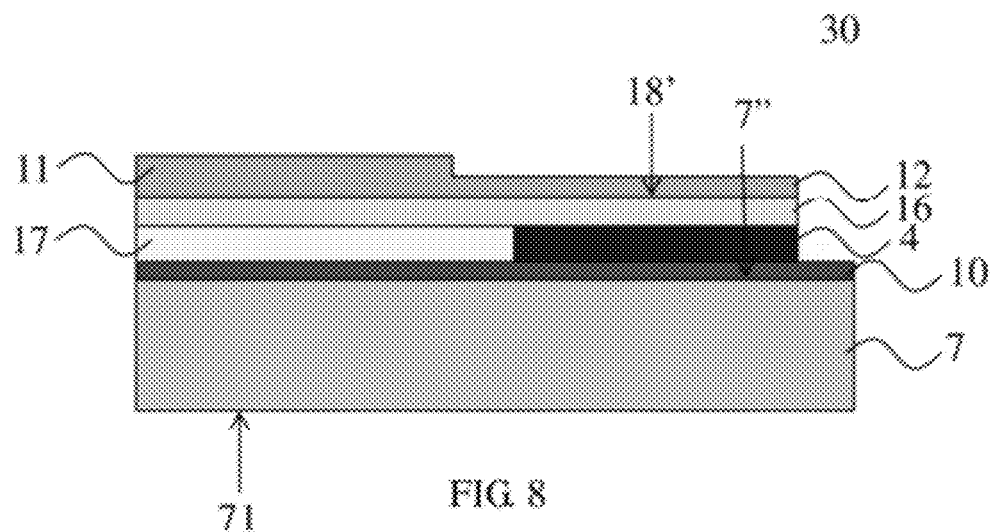
FIG. 8 illustrates a lateral view of a semiconductor optoelectronic device structure according to another embodiment of the present application.

FIG. 7A and FIG. 8 illustrate the lateral views of a semiconductor optoelectronic device 20 and a semiconductor optoelectronic device 30 formed according to the method disclosed in the embodiments of the present application. The semiconductor optoelectronic devices 20 and 30 can be a solar cell or a light-emitting diode.

Figure 7B:
FIG. 7B illustrates a lateral view of a semiconductor epitaxial stack 4 in FIG. 7A.
Figure 7C:
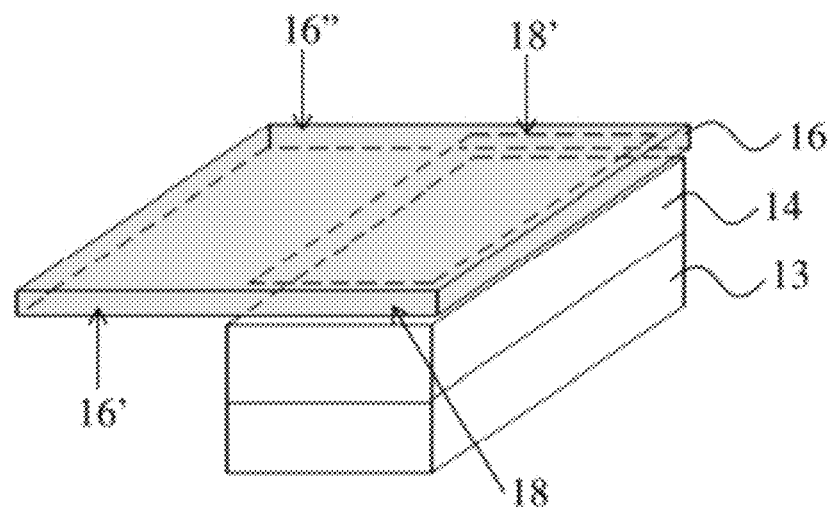
FIG. 7C illustrates an exploded perspective view of a semiconductor epitaxial stack unit 4 and a transparent conductive layer 16 in FIG. 7A.

As shown in FIGS. 7A-7C, the semiconductor optoelectronic device 20 comprises an operating substrate 7 and a semiconductor epitaxial stack unit 4 formed on the operating substrate 7. Zooming in the view of the semiconductor epitaxial stack unit 4 as shown in FIG. 7B, the semiconductor epitaxial stack unit 4 comprises a first semiconductor material layer 13 having a first electrical conductivity like n-type semiconductor material layer formed on the operating substrate 7, and a second semiconductor material layer 14 having a second electrical conductivity like p-type semiconductor material layer formed on the first semiconductor material layer 13. When the semiconductor optoelectronic devices 20 and 30 are the light-emitting diode devices, the semiconductor epitaxial stack unit 4 further comprises a light-emitting layer 15 formed between the first semiconductor material layer 13 and the second semiconductor material layer 14.

As shown in FIG. 7A, the semiconductor optoelectronic device 20 further comprises a transparent conductive layer 16 formed on the operating substrate 7. The transparent conductive layer 16 comprises a first surface 16', and a second surface 16" approximately parallel to the first surface. A directly contacting part 18 is defined as the area where the second semiconductor material layer 14 directly contacts part of the transparent conductive layer 16. A directly contacting corresponding part 18' is defined as the area where the second surface 16" is corresponding to the directly contacting part of the first surface 16' as shown in FIG. 7C. In order to clearly illustrate the contacting area of the transparent conductive layer 16 and the second semiconductor material layer 14 of the semiconductor epitaxial stack unit 4, the transparent conductive layer 16 and the second semiconductor material layer 14 are schematically apart while in fact the transparent conductive layer 16 and the second semiconductor material layer 14 contact directly. The material of the transparent conductive layer 16 comprises indium tin oxide, cadmium tin oxide, zinc oxide, indium oxide, tin oxide, copper aluminum oxide, copper gallium oxide, strontium copper oxide, aluminum zinc oxide, zinc gallium oxide, and the arbitrary combination mentioned above. In order to increase the light emission efficiency or the absorption efficiency of the device, the preferred condition is that the transmittance of the transparent conductive layer 16 covered on the semiconductor epitaxial stack unit 4 should be larger than 90%.

As shown in FIG. 7A, in order to electrically connect the device and the outside, in the embodiment, the operating substrate 7 further comprises a first electrode 11 formed on an area excluding the directly contacting part 18 and the directly contacting corresponding part 18' of the transparent conductive layer 16 to electrically connect to the semiconductor epitaxial stack unit 4 by the transparent conductive layer 16. Because the semiconductor epitaxial stack unit 4 is covered by the transparent materials, either the light emission efficiency or the absorption efficiency of the semiconductor optoelectronic device 20 increases substantially. In order to improve the reliability and the efficiency of the device structure, part of the surface of the semiconductor epitaxial stack unit 4 is protected by an insulating layer 17 like silicon oxide or silicon nitride. In addition, an adhesive layer 10 is optionally formed between the semiconductor epitaxial stack unit 4 and the operating substrate 7 to achieve the adherence there between.

FIG. 8 illustrates the semiconductor optoelectronic device 30 according to one embodiment of the present application. Other than the structure similar to those in the above embodiments, the first electrode 11 of the semiconductor optoelectronic device 30 further comprises a plurality of metal wires 12 extending from the first electrode to the directly contacting corresponding part 18', which improves the electrical conductivity of the device by the low resistivity characteristics of metals. The top view of the semiconductor optoelectronic device 30 is shown in FIG. 6. The material of the first electrode 11 comprises titanium, aluminum, gold, chromium, nickel, germanium, and can be a single-layer or a multi-layer metal structure composed by the above-described alloy. The metal wire 12 preferably has a width smaller than 20 μm, and is optionally composed of material different from that of the first electrode 11.

In addition, in order to achieve the electrical conductivity purpose of the device, the structure further comprises a second electrode (not shown in the drawings) formed between the semiconductor epitaxial stack unit 4 and the operating substrate 7, or on the opposite side of the operating substrate 7 corresponding to the semiconductor epitaxial stack unit 4, namely, a bottom side 71 of the operating substrate. In order to improve the light emission efficiency of the device or for other purposes, the surface of the operating substrate 7 also comprises a textured structure comprising at least one protrusion (not shown in the drawings) and/or at least one cavity (not shown in the drawings).

Figure 11A:
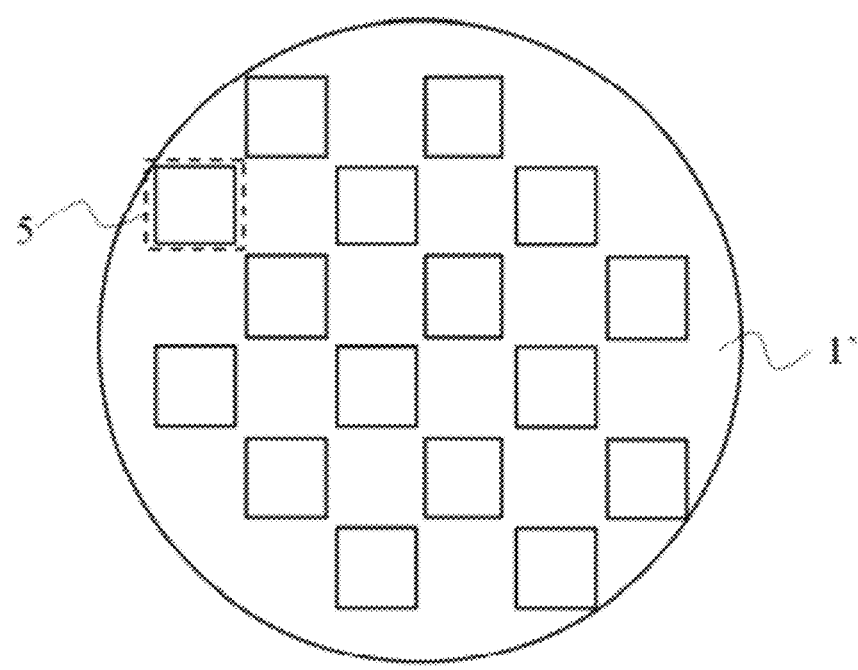
FIG. 11A illustrates a top view of a light-emitting diode device structure according to another embodiment of the present application.
Figure 11B:
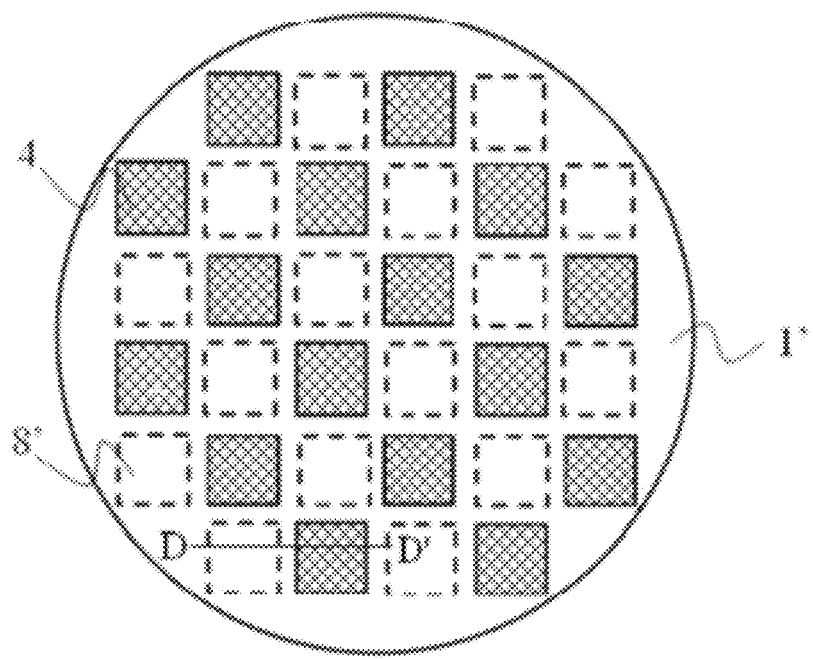
FIG. 11B illustrates a top view of a light-emitting diode device structure according to another embodiment of the present application.
Figure 11C:
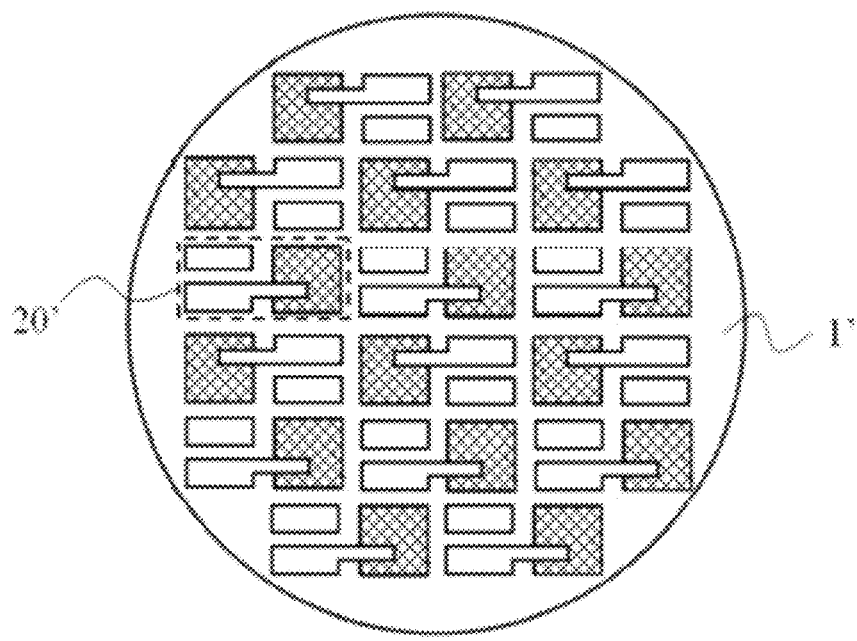
FIG. 11C illustrates a top view of a light-emitting diode device structure according to another embodiment of the present application.

Please refer to FIGS. 11A-11C. FIG. 11A illustrates a growth substrate 1' formed after removing part of the semiconductor epitaxial stack unit 4 by the above-described method. The semiconductor epitaxial stack unit which is protected by the patterned photoresist layer 5 and not removed is remained on the growth substrate 1'. As shown in FIG. 11B, the remaining semiconductor epitaxial stack unit 4 is exposed after the patterned photoresist layer 5 is removed by the photoresist remover. With appropriate steps of selective removing, there is at least one area where the semiconductor epitaxial stack unit is removed adjacent to the remaining semiconductor epitaxial stack unit 4 acts as the electrode area 8'. As shown in FIG. 11C, the semiconductor optoelectronic device 20' is formed by the remaining semiconductor epitaxial stack unit 4 on the growth substrate 1'.

Figure 12A:
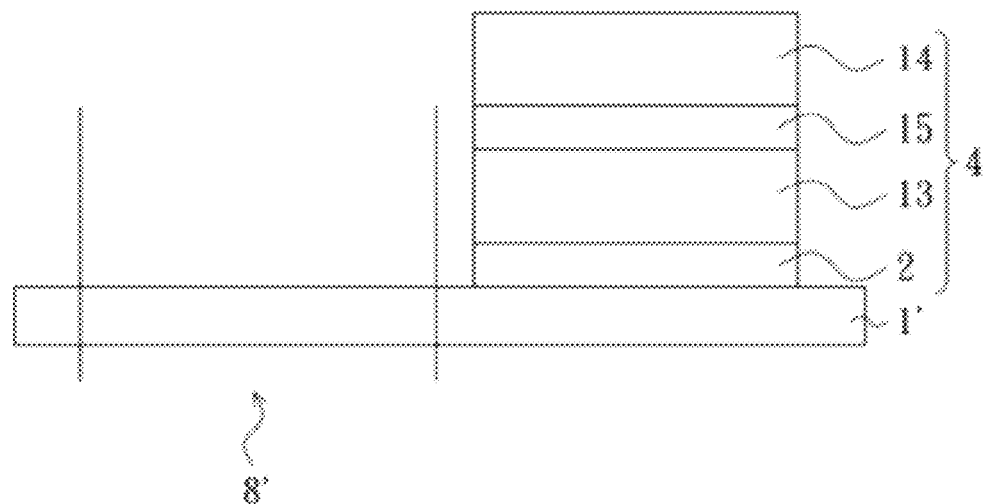
FIG. 12A illustrates a lateral view of the manufacturing method of a semiconductor optoelectronic device taken along line D-D' of FIG. 11B.

FIGS. 12A-12I illustrate the process steps of manufacturing of the semiconductor optoelectronic device 20'. FIG. 12A illustrates a lateral view of the semiconductor epitaxial stack unit 4 and the adjacent electrode area 8' taken along line D-D' of FIG. 11B. Just like the removed semiconductor epitaxial stack unit 4, the structure of the remaining semiconductor epitaxial stack unit 4 on the growth substrate 1' comprises a first semiconductor material layer 13 having a first electrical conductivity like n-type semiconductor material layer and a second semiconductor material layer 14 having a second electrical conductivity like p-type semiconductor material layer formed on the first semiconductor material layer 13. When the structure of the semiconductor epitaxial stack unit 4 is the light-emitting diode, the semiconductor epitaxial stack unit 4 further comprises a light-emitting layer 15 formed between the first semiconductor material layer 13 and the second semiconductor material layer 14. In addition, the structure of the remaining semiconductor epitaxial stack unit 4 on the growth substrate 1' is different from the structure of the removed semiconductor epitaxial stack unit 4 that the remaining semiconductor epitaxial stack unit 4 further comprises a sacrificial layer 2 formed between the first semiconductor material layer 13 and the growth substrate 1'.

Figure 12B:
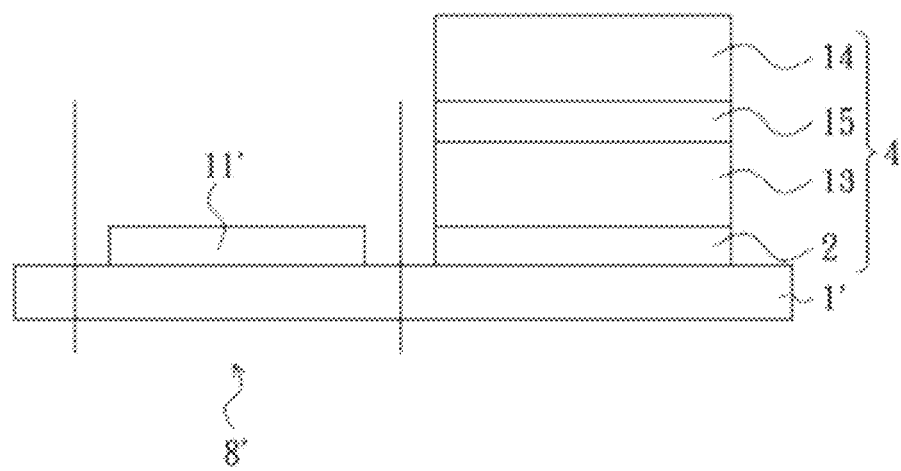
FIG. 12B illustrates a lateral view of the manufacturing method of a semiconductor optoelectronic device taken along line D-D' of FIG. 11B.
Figure 12C:
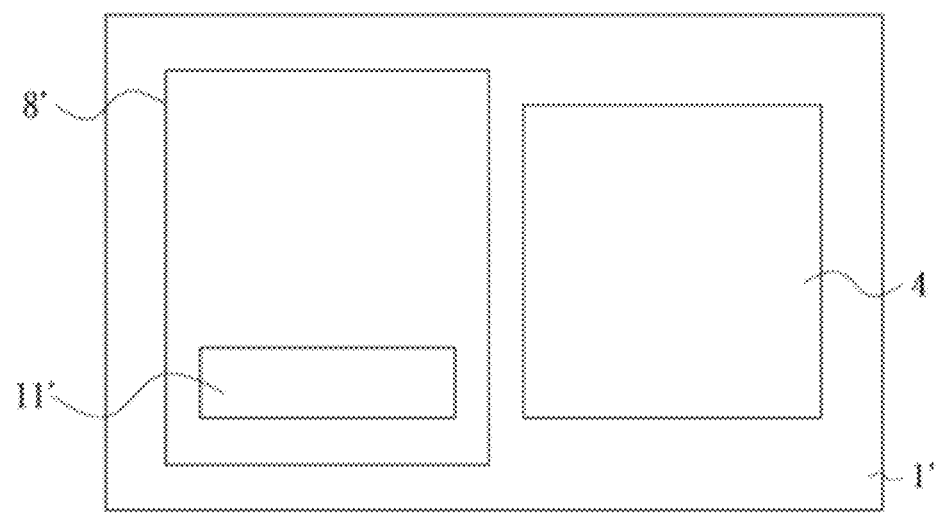
FIG. 12C illustrates a top view of the manufacturing method of a semiconductor optoelectronic device taken along line D-D' of FIG. 11B.

When the growth substrate 1' is a conductive substrate and the sacrificial layer 2 also comprises conductive material, a first electrode 11' can be directly formed on the surface of the growth substrate 1', and is electrically connected to the first semiconductor material layer 13 via the growth substrate 1' and the sacrificial layer 2 as shown in FIG. 12B and FIG. 12C, wherein FIG. 12B illustrates a lateral view and FIG. 12C illustrates a top view.

Figure 12D:
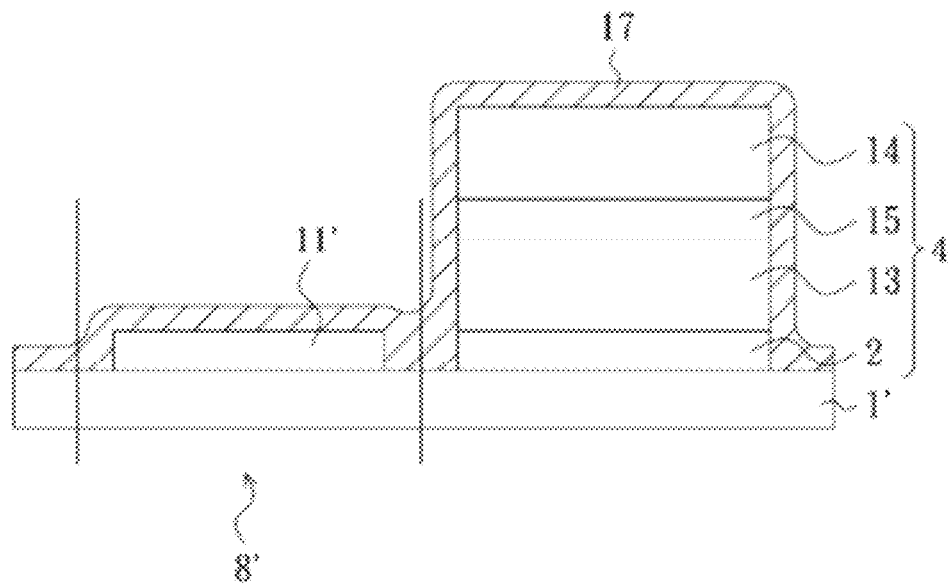
FIG. 12D illustrates a lateral view of the manufacturing method of a semiconductor optoelectronic device taken along line D-D' of FIG. 11B.
Figure 12E:
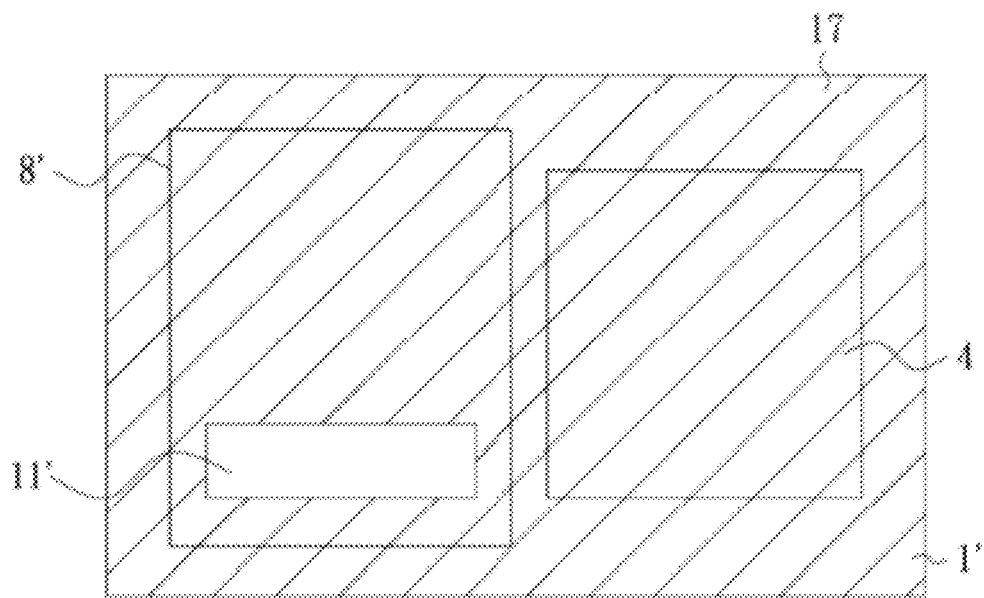
FIG. 12E illustrates a top view of the manufacturing method of a semiconductor optoelectronic device taken along line D-D' of FIG. 11B.

An insulating layer 17 covers the whole growth substrate 1' to electrically insulate the first semiconductor material layer 13 and the second semiconductor material layer 14 as shown in FIG. 12D and FIG. 12E, wherein FIG. 12D illustrates a lateral view and FIG. 12E illustrates a top view.

Figure 12F:
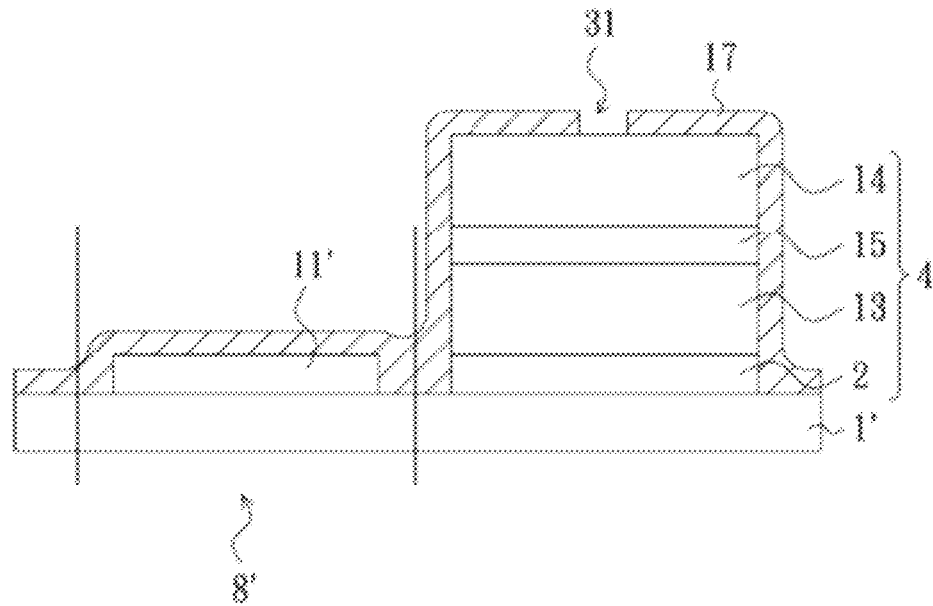
FIG. 12F illustrates a lateral view of the manufacturing method of a semiconductor optoelectronic device taken along line D-D' of FIG. 11B.
Figure 12G:
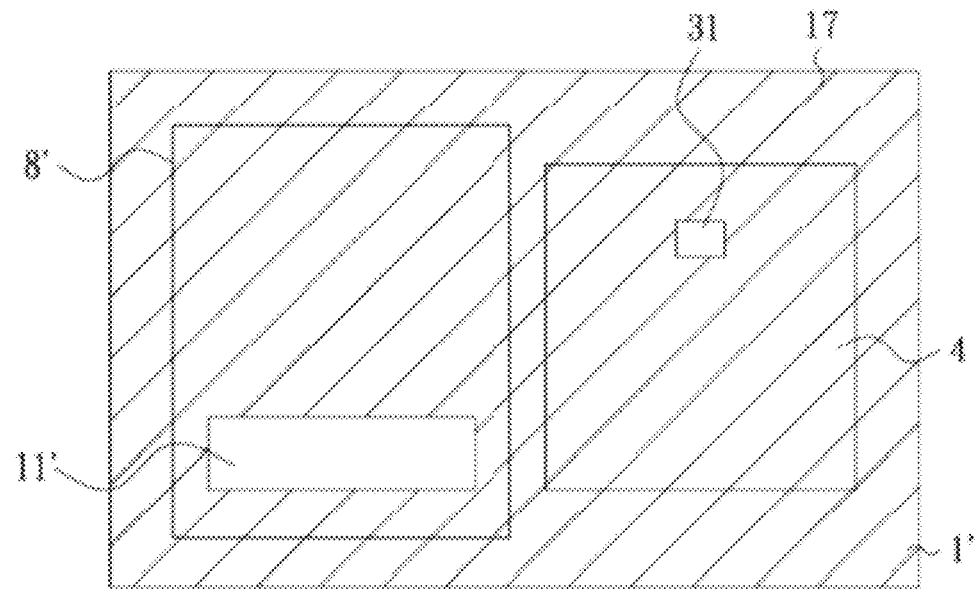
FIG. 12G illustrates a top view of the manufacturing method of a semiconductor optoelectronic device taken along line D-D' of FIG. 11B.

The conventional lithography and etch technologies are used to form at least one opening 31 in the insulating layer on the surface of the semiconductor epitaxial stack unit 4 and expose the second semiconductor material layer 14. The opening acts as the channel to electrically connect the second electrode and the second semiconductor material layer 14. In the embodiment, the quantity of the opening 31 is one. However, the quantity and the profile of the opening 31 are not restricted as shown in FIG. 12F and FIG. 12G in the application, wherein FIG. 12F illustrates a lateral view and FIG. 12G illustrates a top view. The insulating layer 17 of the first electrode 11' is removed by lithography and etch processes, and the channel for electrically connecting the outside circuit or other optoelectronic device in the future is provided.

Figure 12H:
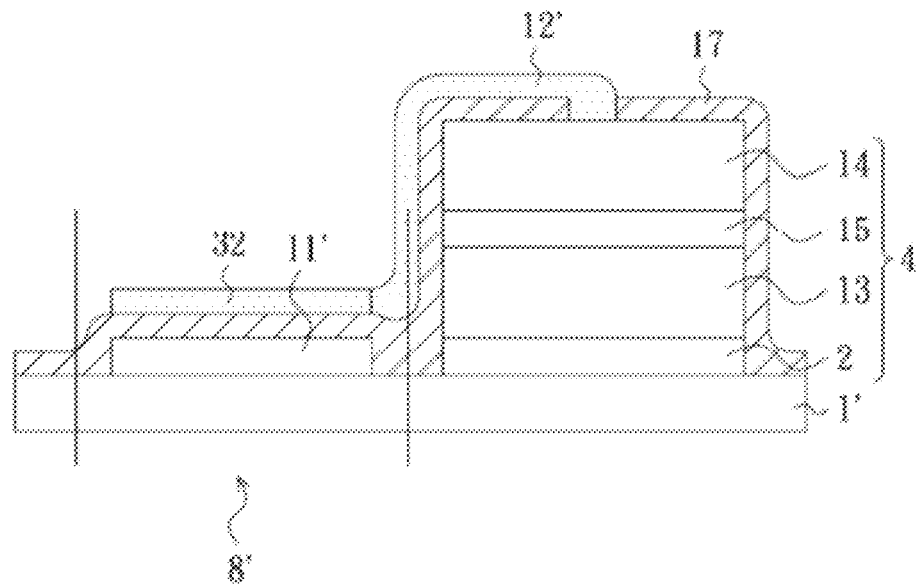
FIG. 12H illustrates a lateral view of the manufacturing method of a semiconductor optoelectronic device taken along line D-D' of FIG. 11B.
Figure 12I:
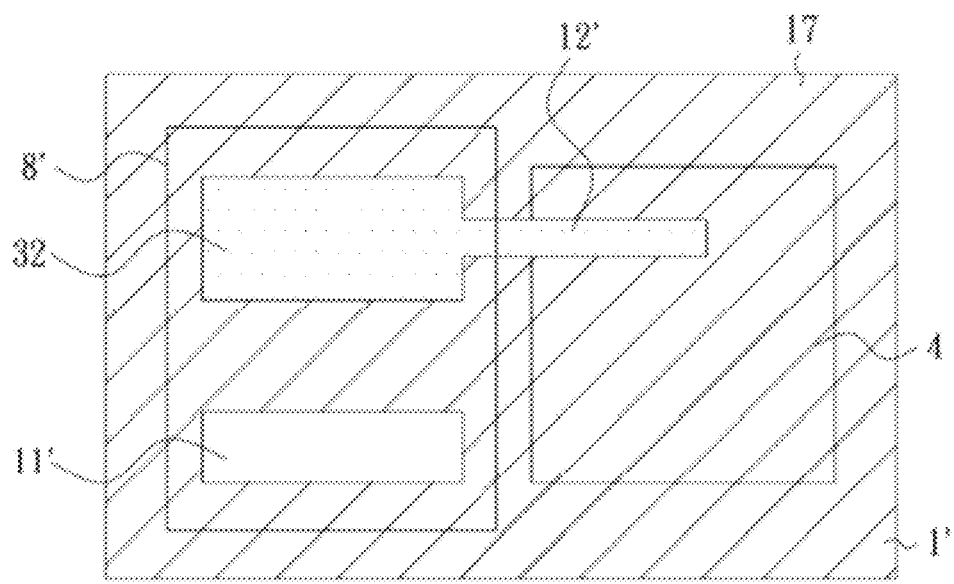
FIG. 12I illustrates a top view of the manufacturing method of a semiconductor optoelectronic device taken along line D-D' of FIG. 11B.

A second electrode 32 is formed on the top of the insulating layer 17 of the electrode area 8', and a metal wire 12' is extended from the opening 31 to the second electrode 32. The second semiconductor material layer 14 is electrically connected to the second electrode 32 by the metal wire 12'. The material of the first electrode 11' and the second electrode 32 comprises titanium, aluminum, gold, chromium, nickel, germanium, or a single-layer or a multi-layer metal structure composed by the above-described alloy. The metal wire 12' preferably has a width smaller than 20 μm and comprises the same or different material compared with that of the first electrode 11 and the second electrode 32 which are formed by the same or different process steps. For example, when the semiconductor optoelectronic device 20' is a light-emitting diode device, the metal wire 12' formed on the top of the first semiconductor epitaxial stack unit 4 can be replaced by a transparent conductive layer as needed in order to increase the light emission area of the device. The material of the transparent conductive layer comprises indium tin oxide, cadmium tin oxide, zinc oxide, indium oxide, tin oxide, copper aluminum oxide, copper gallium oxide, strontium copper oxide, aluminum zinc oxide, zinc gallium oxide, and the combination of the materials mentioned above. As shown in FIG. 12H and FIG. 12I, FIG. 12H illustrates a lateral view and FIG. 12E illustrates a top view.

The order of the process steps of the semiconductor optoelectronic device 20' is not limited to the above. For example, the process steps of the first electrode 11' and the insulating layer 17 can be exchanged. The surface of the growth substrate 1' is wholly covered by the insulating layer 17 first, then the first electrode 11' and the opening 31 are exposed by lithography and etch processes, finally the first electrode 11', the second electrode 32 and the metal wire 12' (or the transparent conductive layer) are formed.

After the process mentioned above is completed, each of the semiconductor optoelectronic devices 20' remained on the growth substrate 1' can be separated by the scribing and breaking.

Figure 13A:
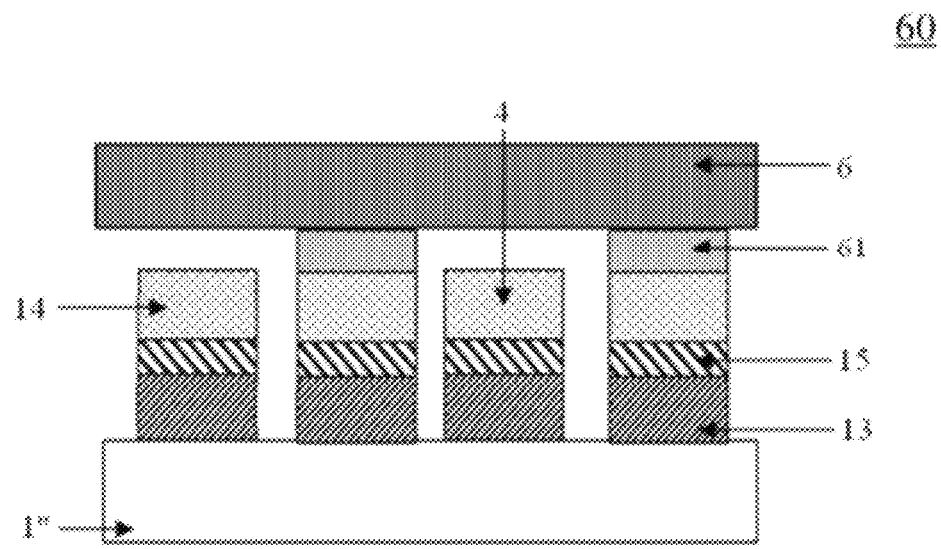
FIG. 13A illustrates a lateral view of the manufacturing method of a light-emitting diode device structure according to another embodiment of the present application.
Figure 13B:
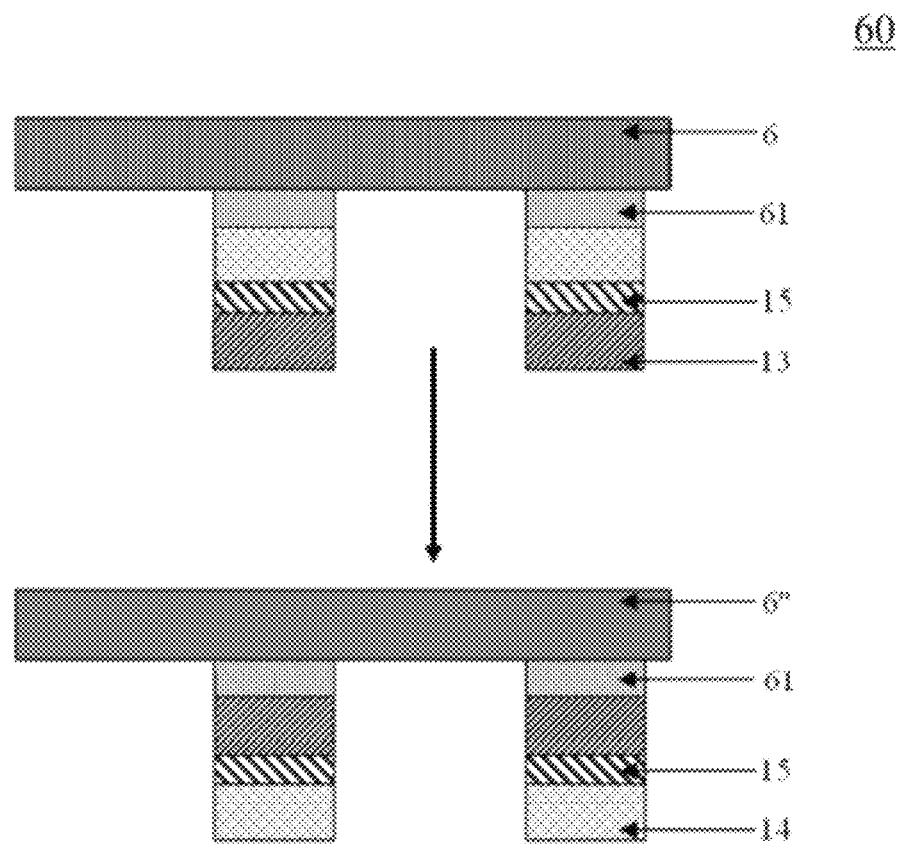
FIG. 13B illustrates a lateral view of the manufacturing method of a light-emitting diode device structure according to another embodiment of the present application.
Figure 13C:
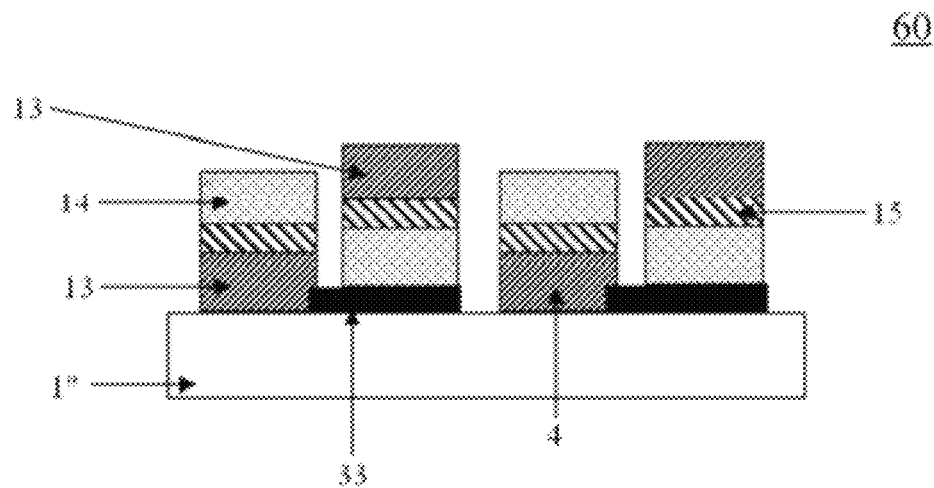
FIG. 13C illustrates a lateral view of the manufacturing method of a light-emitting diode device structure according to another embodiment of the present application.

FIGS. 13A-13C illustrate the manufacturing processes of a light-emitting diode structure 60 according to another embodiment of the present application. First, a non-conductive growth substrate 1" is provided as shown in FIG. 13A. Then, a sacrificial layer (not shown in the drawings) is formed on the non-conductive growth substrate 1". A first semiconductor material layer 13 like n-type semiconductor material layer is formed on the sacrificial layer. A second semiconductor material layer 14 like p-type semiconductor material layer is formed on the first semiconductor material layer. A light-emitting layer 15 is formed between the first semiconductor material layer 13 and the second semiconductor material layer 14. The above-described semiconductor epitaxial stack including the sacrificial layer, the first semiconductor material layer 13, the light-emitting layer 15, and the second semiconductor material layer 14 is separated into a plurality of semiconductor epitaxial stack units 4 by the conventional method comprising dry etch, wet etch, or laser scribing.

A transfer structure 6 and a transfer structure 6" are used for the second transfer process as shown in FIG. 13A and FIG. 13B. The material of the transfer structure 6 (6") comprises organic polymer like expanded polystyrene or PI tape. The transfer structure 6 comprises a transfer surface facing the second semiconductor material layer 14. The transfer surface comprises an adhesive surface or at least one protrusion 61 corresponding to the semiconductor epitaxial stack unit 4 which needs to be transferred. Part of the semiconductor epitaxial stack unit 4 is transferred to the transfer structure 6 by the similar method described above as shown in FIG. 13B. Then, the semiconductor epitaxial stack unit 4 is inverted on the transfer structure 6" by the second transfer.

Part of the semiconductor epitaxial stack units 4 is remained on the original non-conductive growth substrate 1" as shown in FIG. 13C. With appropriate steps of selective removing, the area where the semiconductor epitaxial stack unit is removed adjacent to the remaining semiconductor epitaxial stack unit 4 acts as the electrode area. An underlying conductive connecting structure 33 is formed on the electrode area of the non-conductive growth substrate 1" to directly contact the first semiconductor material layer 13 or the sacrificial layer when the sacrificial layer is conductive and electrically connected to the first semiconductor material layer 13. The inverted semiconductor epitaxial stack unit 4 of the transfer structure 6" is bonded to the electrode area of the original non-conductive growth substrate 1" to electrically connect the underlying conductive connecting structure 33 and the second semiconductor material layer 14 of the semiconductor epitaxial stack unit 4, and after that the transfer structure 6" is removed. The first semiconductor material layer 13 of the semiconductor epitaxial stack unit 4 not removed is electrically connected to the second semiconductor material layer 14 of the secondly transferred semiconductor epitaxial stack unit 4 by the underlying conductive connecting structure 33, namely, every two semiconductor epitaxial stack units 4 are connected in series.

Every two semiconductor epitaxial stack units 4 connected in series are further connected in series to form a high voltage light-emitting diode structure through a conductive connecting structure 33'. For example, an insulating layer is formed between the adjacent two light-emitting diodes which are connected in series. Then, the conductive connecting structure is formed on the insulating layer. Part of the insulating layer is removed by the conventional method like exposure, develop, and etch, so that part of the surface of the semiconductor material layer is exposed to directly contact the conductive connection structure. Thus, every two of the semiconductor epitaxial stack units 4 connected in series are further connected to one another by the conductive connecting structure. The first electrode 11' and the second electrode 32' are respectively formed on the surfaces of the first and the last semiconductor epitaxial stack units 4 of the structure of the high voltage light-emitting diode electrically connected in series to connect the external power supply or other optoelectronic device. The quantity of series of the semiconductor epitaxial stack units 4 in the light-emitting diode is not limited by the embodiment.

Figure 13D:
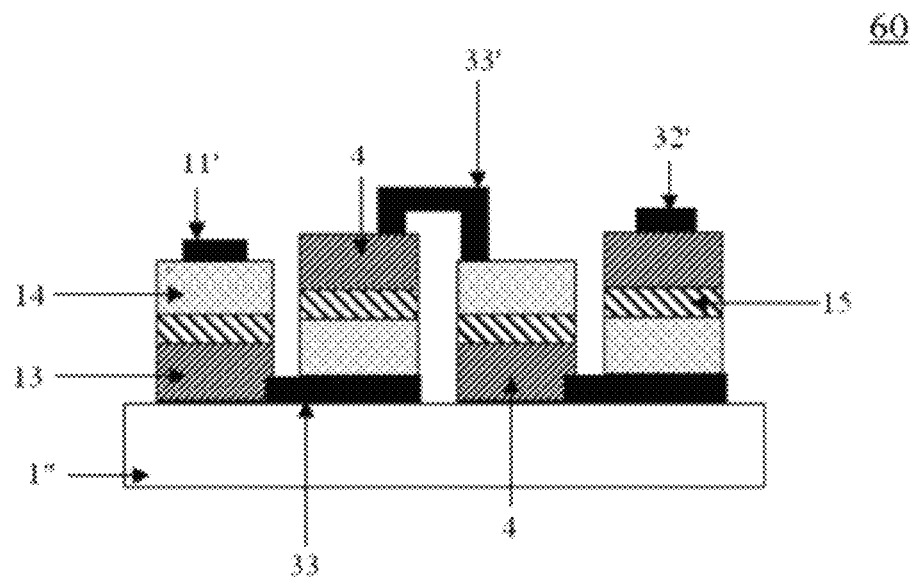
FIG. 13D illustrates a lateral view of the manufacturing method of a light-emitting diode device structure according to another embodiment of the present application.

The manufacturing method of the light-emitting diode structure illustrated in the embodiment is using the conductive connecting structure to electrically connect the adjacent semiconductor epitaxial stack units in series. Because the first semiconductor material layer of the first semiconductor epitaxial stack unit and the second semiconductor material layer of the adjacent semiconductor epitaxial stack unit are formed on the top or the bottom of the semiconductor epitaxial stack unit, the conductive connection structure is formed at a similar height level, as FIG. 13D shows. In FIG. 13D, the conductive connection structures 33 and 33' are formed on the surface of the growth substrate or the surface of the semiconductor epitaxial unit. The yield is improved because there is no step height in the conductive connection structure when the conductive connection structure connects the semiconductor material layer on the bottom of the semiconductor epitaxial stack unit and the semiconductor material layer on the top of the neighboring semiconductor epitaxial stack unit in the same time.

Figure 9A:
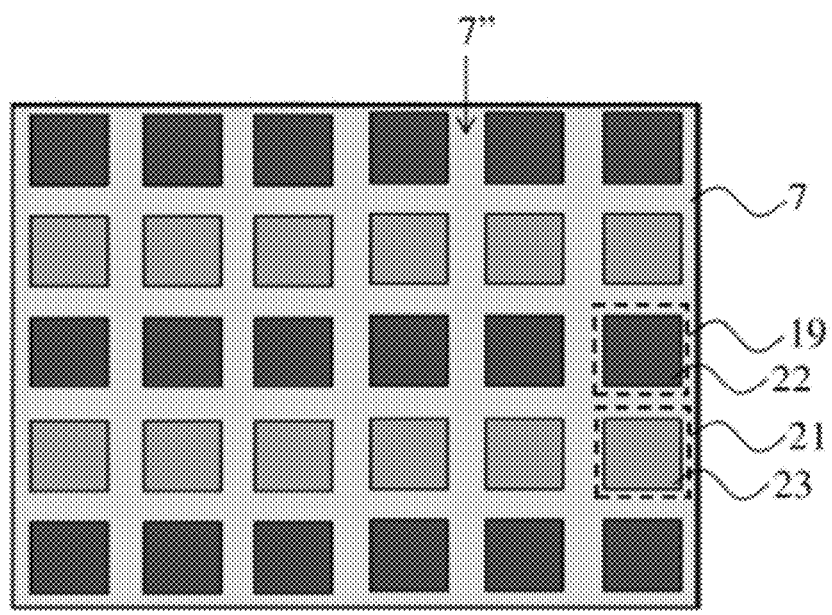
FIG. 9A illustrates a lateral view of a light-emitting diode device structure according to another embodiment of the present application.

FIG. 9A illustrates another light-emitting diode structure 40 according to one embodiment of the present application. The light-emitting diode structure 40 comprises an operating substrate 7 with an operating substrate surface 7". The operating substrate surface 7" comprises a plurality of first epitaxial areas 19 and a plurality of second epitaxial areas 21. Each of the epitaxial areas comprises one semiconductor optoelectronic device described above (here referring as the light-emitting diode device). That is, each of the epitaxial areas comprises one light-emitting diode epitaxial stack unit. The first epitaxial area 19 comprises a first light-emitting diode epitaxial stack unit 22 capable of emitting a first major emission wavelength. In the embodiment, the first major emission wavelength is the red light, and the wavelength is between 600 nm and 650 nm. Depending on the needs, the first major emission wavelength can be the green light between 510 nm and 550 nm, or be the blue light between 390 nm and 440 nm. The second epitaxial area 21 comprises a second light-emitting diode epitaxial stack unit 23 capable of emitting the second major emission wavelength. In the embodiment, the second major emission wavelength is the green light, and the wavelength is between 510 nm and 550 nm. As illustrated in the embodiment, the first major emission wavelength can be different from the second major emission wavelength.

With the method of the semiconductor optoelectronic device illustrated in the above-described embodiments, even the single operating substrate comprises two kinds (like structure 40) or more epitaxial stack units (here referring as the light-emitting diode epitaxial stack units capable of emitting different major emission wavelengths), the plurality of light-emitting diode epitaxial stack units formed on the different positions of the single growth substrate and capable of emitting the same major emission wavelength is transferred from the growth substrate to the operating substrate. Taking the structure 40 of FIG. 9A as an example, only two transfer processes are needed. The preliminary structure of all of the epitaxial stack units formed on the operating substrate is completed by the first transfer of the red light epitaxial stack unit from the growth substrate of the red light light-emitting diode device, and the second transfer of the green light epitaxial stack unit from the growth substrate of the green light light-emitting diode device. Without transferring one-by-one by manual pick-up or mechanical pick-up, the process time is reduced.

Figure 9B:
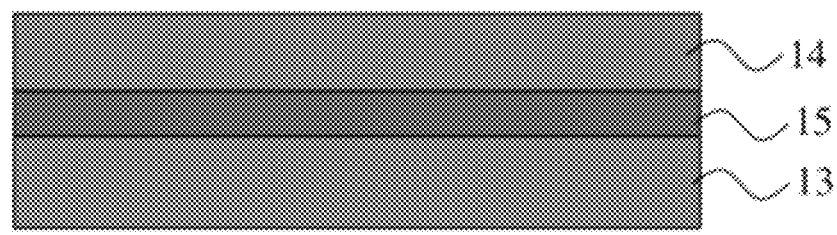
FIG. 9B illustrates a lateral view of a semiconductor epitaxial stack according to FIG. 9A.

As shown in FIG. 9B, in the light-emitting diode structure 40, each of the light-emitting diode epitaxial stack units 22 and 23 respectively comprises a first semiconductor material layer 13 having a first electrical conductivity such as the p-type semiconductor material layer, a second semiconductor material layer 14 having a second electrical conductivity such as the n-type semiconductor material layer formed on the first semiconductor material layer 13, and a light-emitting layer 15 formed between the first semiconductor material layer 13 and the second semiconductor material layer 14.

In addition, as described in the above embodiment, in order to achieve the electrical conductivity purpose of the device, in the structure 40, each first light-emitting diode epitaxial stack unit 22 and/or each second light-emitting diode epitaxial stack unit 23 further comprises a first electrode (not shown in the drawings) formed on the opposite side of the semiconductor epitaxial stack unit corresponding to the operating substrate. In the embodiment, the first electrode is formed on the semiconductor epitaxial stack unit, or between the semiconductor epitaxial stack unit and the surface 7" of the operating substrate 7, or on the opposite side of the operating substrate 7 corresponding to the semiconductor epitaxial stack unit (namely, the bottom surface of the operating substrate). In order to increase the light emission efficiency of the device, the surface of the operating substrate 7 also comprises the textured structure comprising at least one protrusion (not shown in the drawings) and/or at least one cavity (not shown in the drawings).

Figure 10:
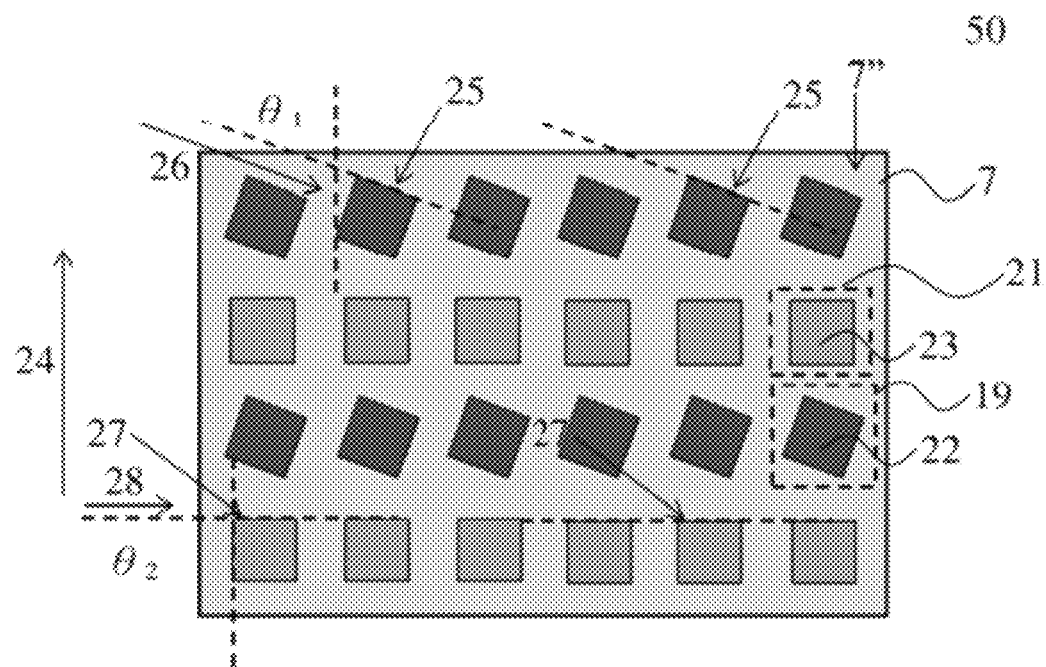
FIG. 10 illustrates a lateral view of a light-emitting diode device structure according to another embodiment of the present application.

During each transfer process, there is a possibility of miss-alignment between the operating substrate 7 and the transfer structure 6(6"). The light-emitting diode structure with the selective transfer process may incur the miss-alignment as shown in FIG. 10. Taking the light-emitting diode structure 50 as an example, a first direction 24 is defined to be vertical to the normal line of the surface 7" of the operating substrate 7 as shown in FIG. 10. Because all of the first light-emitting diode epitaxial stack units 22 capable of emitting the first major emission wavelength are transferred to the operating substrate 7 in the same time, the angle shift of the transfer structure indirectly affects all of the first light-emitting diode epitaxial stack units 22 attached to the transfer structure to have the same alignment angle shift. Similarly, the second light-emitting diode epitaxial stack units 23 capable of emitting the second major emission wavelength are transferred to the operating substrate 7 in the same time, so there is the similar effect of alignment angle shift. Taking one of the first light-emitting diode epitaxial stack units 22 as an example which has a first side 25 parallel to the surface 7" of the operating substrate 7, extending the extension line along the first side 25 of every first light-emitting diode epitaxial stack unit 22, and all the extension lines having a first extension direction 26 that are substantially parallel. Similarly, taking one of the second light-emitting diode epitaxial stack unit 23 as an example which has a first side 27 parallel to the surface 7" of the operating substrate 7 corresponding to the first light-emitting diode epitaxial stack unit 22 extending the extension line along the first side 27 of every second light-emitting diode epitaxial stack unit 23, and all the extension lines having a second extension direction 28 that are substantially parallel. The alignment angle shifts generated from the two transfer processes are not the same. Taking the first direction 24 as a basis, there is an angle $\theta_1$ formed between the first extension direction 26 and the first direction 24, and an angle $\theta_2$ formed between the second extension direction 28 and the first direction 24, wherein $\theta_1$ is not equal to $\theta_2$. In the embodiment, $\theta_1$ approximately equals to 70 degrees and $\theta_2$ approximately equals to 90 degrees.

The transfer method of the semiconductor optoelectronic device illustrated in the present application completely keeps the growth substrate of the semiconductor optoelectronic device for repeated use. The transfer method also transfers the multi semiconductor optoelectronic device units to the operating substrate in single transfer process by the selective method, thus the process is simplified. The method has the advantage of cost reduction and process time reduction for the manufacture of the multi-color light-emitting device or the multi-color display.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. A semiconductor optoelectronic device, comprising: a growth substrate;
a semiconductor epitaxial stack unit formed on the growth substrate, comprising:
a sacrificial layer with electrical conductivity formed on the growth substrate; a first semiconductor material layer having a first electrical conductivity formed on the sacrificial layer; and
a second semiconductor material layer having a second electrical conductivity formed on the first semiconductor material layer;
a first electrode directly formed on the growth substrate and electrically connected to the first semiconductor material layer via the growth substrate;
an insulating layer formed on the growth substrate and comprising a first opening to expose the first electrode;
a second electrode formed on the insulating layer, wherein a portion of the insulating layer is between the second electrode and the growth substrate; and
a conductive connection structure electrically connecting the second electrode with the second semiconductor material layer,
wherein the second electrode and the conductive connection structure are not overlapped with the first electrode from a top view of the semiconductor optoelectronic device, the second electrode is overlapped with the first, electrode from a lateral view of the semiconductor optoelectronic device, and
wherein the first electrode and the second electrode are both next to a same side of the semiconductor epitaxial stack unit such that the first electrode is positioned beside the second electrode on the same side of the semiconductor epitaxial stack unit.

2. The semiconductor optoelectronic device as claimed in claim 1, wherein the semiconductor epitaxial stack unit further comprises a light-emitting layer formed between the first semiconductor material layer and the second semiconductor material layer.

3. The semiconductor optoelectronic device as claimed in claim 1, wherein the insulating layer is formed on a surface of the semiconductor epitaxial stack unit and comprises a second opening exposing part of the second semiconductor material layer.

4. The semiconductor optoelectronic device as claimed in claim 3, wherein the conductive connection structure is electrically connected to the second semiconductor material layer and the second electrode through the second opening.

5. The semiconductor optoelectronic device as claimed in claim 1, wherein the semiconductor optoelectronic device is a solar cell.

6. The semiconductor optoelectronic device as claimed in claim 4, wherein the conductive connection structure is a metal wire.

7. The semiconductor optoelectronic device as claimed in claim 6, wherein the metal wire comprises a width smaller than 20 pm, and/or a material of the metal wire is different with that of the second electrode.

8. The semiconductor optoelectronic device as claimed in claim 1, wherein a material of the first electrode comprises titanium, aluminum, gold, chromium, nickel, germanium, or a single-layer or a multi-layer metal structure composed by an above-described alloy.

9. The semiconductor optoelectronic device as claimed in claim 1, wherein a material of the sacrificial layer comprises aluminum arsenide (AlAs), aluminum gallium arsenide (AlGaAs), or zinc oxide (ZnO).

10. The semiconductor optoelectronic device as claimed in claim 4, wherein the second electrode and the second opening are at opposite ends of the conductive connection structure.

11. The semiconductor optoelectronic device as claimed in claim 1, wherein the first electrode is parallel with the second electrode from a top view of the semiconductor optoelectronic device.

* * * * *